(12) United States Patent
Abe et al.

(10) Patent No.: US 12,295,190 B2
(45) Date of Patent: May 6, 2025

(54) LIGHT-EMITTING DEVICE AND METHOD OF MANUFACTURING THE LIGHT-EMITTING DEVICE

(71) Applicant: NICHIA CORPORATION, Anan (JP)

(72) Inventors: Shogo Abe, Tokushima (JP); Keita Shimizu, Komatsushima (JP); Takashi Kadota, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/882,925

(22) Filed: Aug. 8, 2022

(65) Prior Publication Data
US 2022/0384695 A1 Dec. 1, 2022

Related U.S. Application Data

(63) Continuation of application No. 16/995,016, filed on Aug. 17, 2020, now Pat. No. 11,456,402.

(30) Foreign Application Priority Data

Aug. 19, 2019 (JP) .................................. 2019-149936

(51) Int. Cl.
*H10H 20/854* (2025.01)
*H01L 25/16* (2023.01)
(Continued)

(52) U.S. Cl.
CPC ......... *H10H 20/854* (2025.01); *H01L 25/165* (2013.01); *H01L 25/167* (2013.01);
(Continued)

(58) Field of Classification Search
CPC ....... H01L 2933/0091; H01L 2933/005; H01L 2924/181; H01L 33/486; H01L 33/504; H01L 33/54; H01L 25/165; H01L 33/60
See application file for complete search history.

(56) References Cited

U.S. PATENT DOCUMENTS

| 9,893,250 | B1 | 2/2018 | Ichikawa et al. |
| 2003/0080341 | A1 | 5/2003 | Sakano et al. |

(Continued)

FOREIGN PATENT DOCUMENTS

| JP | 2002-033520 A | 1/2002 |
| JP | 2006-295018 A | 10/2006 |

(Continued)

OTHER PUBLICATIONS

Final Office Action on U.S. Appl. No. 16/995,016 DTD Mar. 18, 2022.

(Continued)

*Primary Examiner* — Antonio B Crite
(74) *Attorney, Agent, or Firm* — Foley & Lardner LLP

(57) ABSTRACT

A light-emitting device includes: a package defining a recess; a light-emitting element disposed on a bottom surface of the recess; and a sealing member disposed in the recess so as to cover the light-emitting element. The sealing member includes a filler-containing layer which contains a filler and covers the light-emitting element, and a light-transmissive layer disposed on the filler-containing layer. The recess is further defined by a lateral surface having a stepped portion between the bottom surface of the recess and an opening of the recess. The light-transmissive layer covers the stepped portion. An upper surface of the light-transmissive layer is downwardly recessed.

11 Claims, 5 Drawing Sheets

(51) Int. Cl.
    *H10H 20/01*         (2025.01)
    *H10H 20/80*         (2025.01)
    *H10H 20/85*         (2025.01)
    *H10H 20/857*       (2025.01)
    *H01L 23/00*          (2006.01)
    *H10H 20/851*       (2025.01)

(52) U.S. Cl.
    CPC ..... *H10H 20/8506* (2025.01); *H10H 20/0361* (2025.01); *H10H 20/0362* (2025.01); *H10H 20/8514* (2025.01); *H10H 20/857* (2025.01); *H10H 20/882* (2025.01)

(56) References Cited

U.S. PATENT DOCUMENTS

| | | | |
|---|---|---|---|
| 2008/0037252 A1* | 2/2008 | Nii | H01L 24/49 257/E33.059 |
| 2008/0303411 A1 | 12/2008 | Ohta et al. | |
| 2009/0039369 A1* | 2/2009 | Niino | H01L 33/54 257/98 |
| 2012/0112623 A1* | 5/2012 | Kobashi | H01L 33/504 313/483 |
| 2013/0188381 A1 | 7/2013 | Kotani | |
| 2014/0339585 A1 | 11/2014 | Liao et al. | |
| 2016/0020369 A1 | 1/2016 | Ukawa | |
| 2016/0111610 A1* | 4/2016 | Ota | H01L 33/56 252/301.36 |
| 2016/0233396 A1 | 8/2016 | Ota et al. | |
| 2016/0254417 A1 | 9/2016 | Morimura et al. | |
| 2016/0268485 A1 | 9/2016 | Morimura et al. | |
| 2017/0155022 A1 | 6/2017 | Tomonari et al. | |
| 2018/0062049 A1 | 3/2018 | Otsuka et al. | |
| 2018/0097161 A1* | 4/2018 | Sano | H01L 33/58 |
| 2019/0058092 A1* | 2/2019 | Oyamada | H01L 33/504 |
| 2019/0355883 A1* | 11/2019 | Yeh | H01L 33/60 |

FOREIGN PATENT DOCUMENTS

| | | |
|---|---|---|
| JP | 2008-041917 A | 2/2008 |
| JP | 2009-016779 A | 1/2009 |
| JP | 2012-114416 A | 6/2012 |
| JP | 2013-149906 A | 8/2013 |
| JP | 2013-183042 A | 9/2013 |
| JP | 2014-229901 A | 12/2014 |
| JP | 2016-029720 A | 3/2016 |
| JP | 2016-054176 A | 4/2016 |
| JP | 2016-082212 A | 5/2016 |
| JP | 2016-162850 A | 9/2016 |
| JP | 2016-167493 A | 9/2016 |
| JP | 2017-069457 A | 4/2017 |
| JP | 2017-108091 A | 6/2017 |
| JP | 2018-082034 A | 5/2018 |
| WO | WO-2016/142992 A1 | 9/2016 |

OTHER PUBLICATIONS

Notice of Allowance on U.S. Appl. No. 16/995,016 DTD Jun. 15, 2022.

U.S. Office Action on U.S. Appl. No. 16/995,016 DTD Nov. 10, 2021.

* cited by examiner

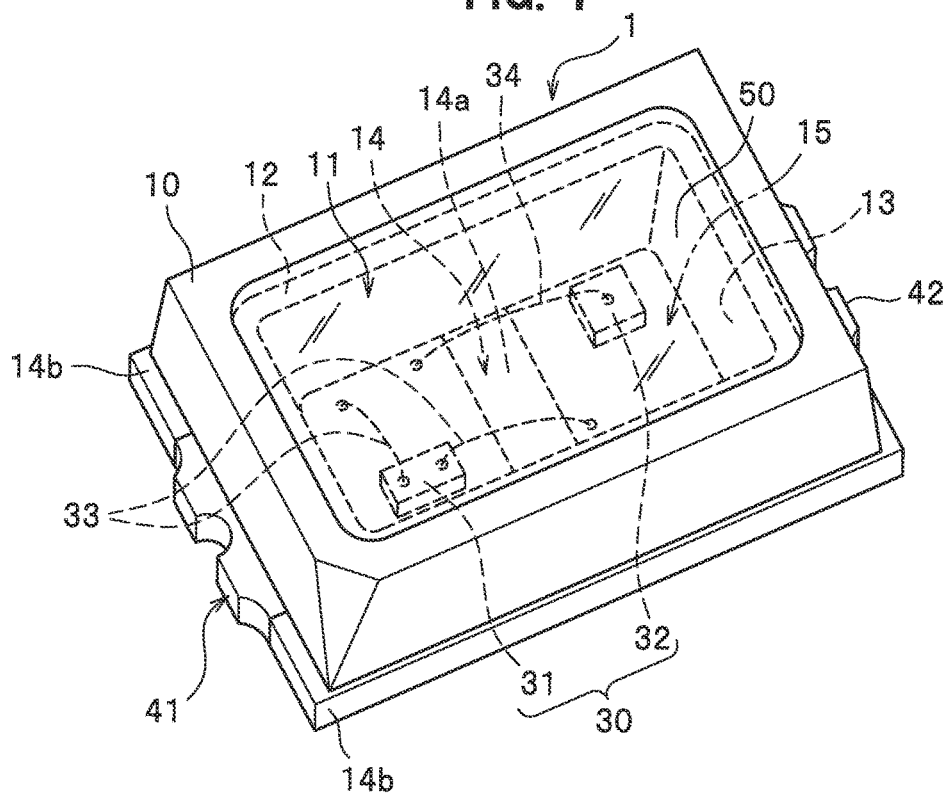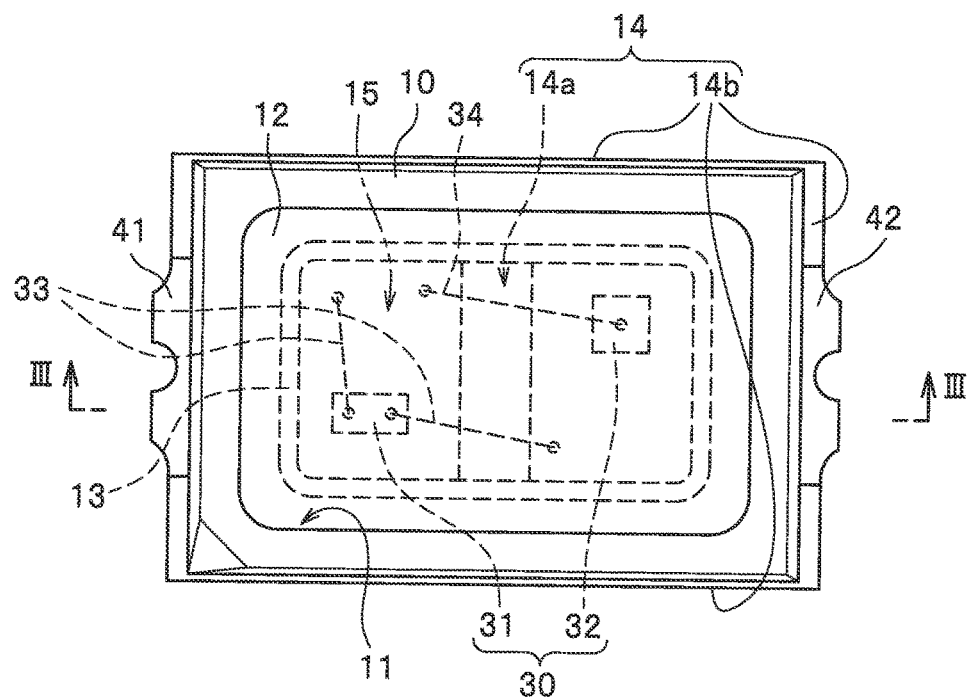

LIGHT-EMITTING DEVICE AND METHOD OF MANUFACTURING THE LIGHT-EMITTING DEVICE

CROSS-REFERENCE TO RELATED APPLICATION

This application is a continuation of U.S. patent application Ser. No. 16/995,016, filed on Aug. 17, 2020, which claims priority to Japanese Patent Application No. 2019-149936, filed on Aug. 19, 2019, the contents of which are hereby incorporated by reference in their entirety.

BACKGROUND

The present disclosure relates to a light-emitting device and a method of manufacturing the light-emitting device.

Light-emitting devices have been used for headlights or the like of vehicles. Light-emitting devices for the exteriors of vehicles are required to emit high-luminance light (see, for example, Japanese Patent Publication No. 2017-108091).

SUMMARY

Light-emitting devices for the interiors of vehicles may be required to have a low luminous intensity when the light-emitting devices are turned on.

An object of certain embodiments of the present disclosure is to provide a light-emitting device that has a low luminous intensity when the light-emitting device is turned on, and a method of manufacturing the light-emitting device.

According to one embodiment of the present disclosure, a light-emitting device includes: a package defining a recess; a light-emitting element mounted on a bottom surface of the recess; and a sealing member disposed in the recess to cover the light-emitting element and made of a light-transmissive resin that contains a filler with an average particle diameter of 200 nm or more and 500 nm or less. The sealing member includes a filler-containing layer, which contains the filler, and a light-transmissive layer that are layered in an order from the bottom surface side of the recess. The filler-containing layer has a thickness of equal to or larger than a height of the light-emitting element.

According to another embodiment of the present disclosure, a method of manufacturing a light-emitting device includes: providing at least one package each defining a recess; mounting a light-emitting element on a bottom surface of the recess; supplying an uncured sealing member into the recess, the uncured sealing member containing a light-transmissive resin and a filler in the light-transmissive resin, the filler having an average particle diameter of 200 nm or more and 500 nm or less; and applying a centrifugal force to the package in a direction perpendicular to the bottom surface of the recess to sediment the filler toward the bottom surface of the recess to form a filler-containing layer, which contains the filler, and a light-transmissive layer in an order from the bottom surface side of the recess.

Certain embodiments of the present disclosure allow for providing a light-emitting device that has a low luminous intensity when the light-emitting device is turned on, and a method of manufacturing the light-emitting device.

BRIEF DESCRIPTION OF THE DRAWINGS

FIG. 1 is a schematic perspective view illustrating an entirety of a light-emitting device according to one embodiment.

FIG. 2 is a schematic plan view of the light-emitting device according to one embodiment.

DETAILED DESCRIPTION

Figure 3:
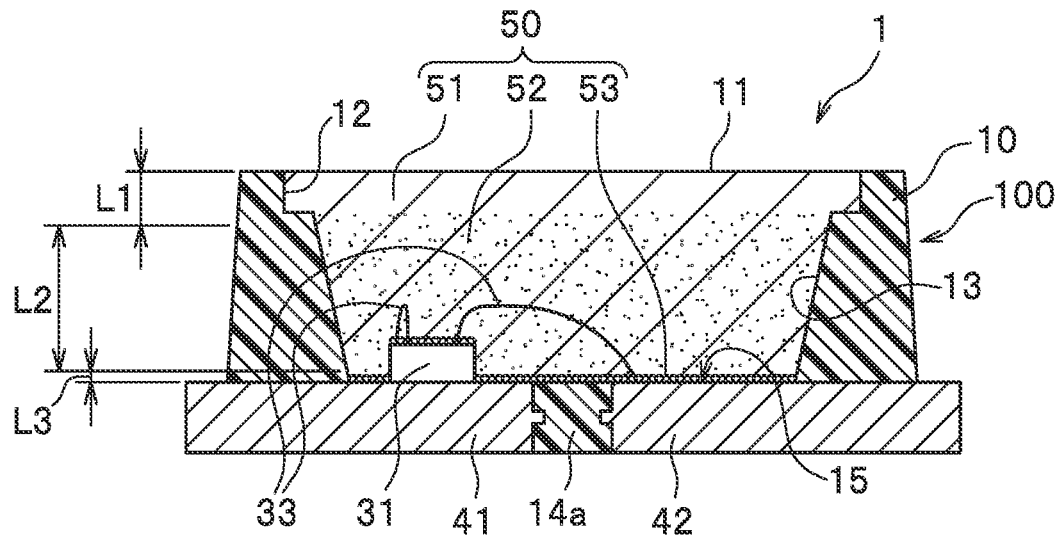
FIG. 3 is a schematic cross-sectional view taken along line III-III of FIG. 2.

A light-emitting device and a method of manufacturing the light-emitting device according to certain embodiments will be described. The drawings referred to in the descriptions below schematically illustrate certain embodiments of the present invention. The scales, the distances, the positional relationships, and the like of members may be exaggerated, or illustration of portions of members may be omitted. In the descriptions below, the same term or reference numeral generally represents the same member or a member made of the same material, and its detailed description will be omitted when appropriate.

Structure of Light-Emitting Device

Descriptions will be made with reference to the drawings. FIG. 1 is a schematic perspective view illustrating an entirety of a light-emitting device according to one embodiment. FIG. 2 is a schematic plan view of the light-emitting device according to one embodiment. FIG. 3 is a schematic cross-sectional view taken along a line III-III of FIG. 2.

The light-emitting device 1 includes a package 100 defining a recess 11, a light-emitting element 31 disposed on a bottom surface 15 of the recess 11, and a sealing member 50 disposed in the recess 11 to cover the light-emitting element 31. The sealing member is made of a light-transmissive resin 51 that contains a filler 52 with the average particle diameter of 200 nm or more and 500 nm or less. In the light-emitting device 1, the sealing member 50 includes a filler-containing layer L2 that contains the filler 52, and a light-transmissive layer L1 in this order from the bottom surface 15 side of the recess 11. The filler-containing layer L2 has a thickness larger than a height of the light-emitting element 31. That is, an entirety of the light-emitting element 31 is covered with the filler-containing layer L2.

Configurations of the light-emitting device 1 will be described below.

Package

The package 100 includes a first lead 41, a second lead 42, and a resin body 10 that integrally holds the first lead 41 and the second lead 42. The package 100 defines the recess 11. The recess 11 is defined by the bottom surface 15 and lateral surfaces 13 that surround the bottom surface 15. The recess 11 has an opening at upper portions of the lateral surfaces 13, and widens upward from the bottom surface 15 toward the opening of the recess 11. Further, the recess 11 has a stepped portion 12 between the bottom surface 15 and the opening. The stepped portion 12 in this example is located near the opening at the upper portions of the lateral surfaces 13 such that the opening has an area that increases upward from the bottom surface 15 of the recess 11.

The outer periphery of the resin body 10 has a substantially rectangular shape in a plan view. The resin body 10 includes a wall portion that defines the lateral surfaces 13 of the recess 11, and a holding portion 14 that integrally holds the first lead 41 and the second lead 42 at the lower portion of the wall portion.

The holding portion 14 includes a central bottom portion 14a that is located between the first lead 41 and the second lead 42, and a peripheral portion 14b that has a frame shape surrounding the first lead 41 and the second lead 42 in a plan view. The central bottom portion 14a is formed to secure a distance between the first lead 41 and the second lead 42 for electrical insulation.

The bottom surface of the recess 11 is defined by a portion of the first lead 41, a portion of the second lead 42, and the central bottom portion 14a.

Further, the resin body 10 has the stepped portion 12 on a peripheral portion of the lateral surfaces 13 near the opening of the recess 11 so as to increase the opening area from the bottom surface 15 to the opening. The stepped portion 12 serves as, for example, an indication of the boundary between the light-transmissive layer L1 and the filler-containing layer L2, which will be described below. With the stepped portion 12, the opening area of the resin body 10 increases, resulting in increase of the light irradiation surface. This allows for reducing the light intensity per unit area of the light-emitting device 1. Also, in the light-emitting device 1, adhesion of the resin body 10 to the sealing member 50 can be increased.

Examples of the resin body 10 include thermoplastic resins and thermosetting resins.

Examples of thermoplastic resins to be used include polyphthalamide resins, liquid crystal polymers, polybutylene terephthalate (PBT), and unsaturated polyesters.

Examples of thermosetting resins to be used include epoxy resins, modified epoxy resins, silicone resins, and modified silicone resins.

The resin body 10 may contain a light-reflective member. For example, titanium oxide, zinc oxide, zirconium oxide, aluminum oxide, silicon oxide, glass filler, silica, magnesium oxide, antimony oxide, aluminum hydroxide, barium sulfate, magnesium carbonate, and barium carbonate, which are relatively stable against moisture and have a high refractive index and high thermal conductivity, are preferably used for the light-reflective member.

Each of the first lead 41 and the second lead 42 includes an inner lead portion forming the bottom surface 15 of the recess 11 in the package 100, and an outer lead portion located at the outer side of the resin body 10 and at a lower surface of the package 100. At the bottom surface 15 of the recess 11, each of the first lead 41 and the second lead 42 has an area that is large enough to dispose a semiconductor element 30, namely the light-emitting element 31 or a protective element 32, on the bottom surface 15 and establish electrical connection to the semiconductor element 30 via wires 33 and 34. The outer lead portion of each of the first lead 41 and the second lead 42 is exposed at the lower surface of the resin body 10 and protrudes laterally from the peripheral portion 14b of the resin body 10. The lower surface of the package 100 serves as a mounting surface to be mounted on a secondary mounting substrate. A portion of the lower surface of each of the first lead 41 and the second lead 42 is a portion of the outer lead to serve as an external electrode for the light-emitting device 1. In a plan view of the package 100, a central portion of the outer lead defines a depression.

Examples of materials preferably used for the first lead 41 and the second lead 42 include copper and a copper alloy. The outermost surfaces of each of the first lead 41 and the second lead 42 may be plated with, for example, silver, aluminum, copper, or gold.

Ceramic packages that include wiring portions may be used for the package defining a recess.

The light-emitting element 31 is mounted on the bottom surface 15 of the recess 11 of the package 100. In one example, the light-emitting element 31 is mounted on the first lead 41 and electrically connected to the first lead 41 and the second lead 42 via the wires 33. The emission color of the light-emitting element 31 can be selected from any appropriate wavelength according to the purpose. Examples of light-emitting elements configured to emit blue light (light with a wavelength in a range of 430 nm to 490 nm) to be used include nitride semiconductors of GaN-based or InGaN-based semiconductors that can be represented by $In_xAl_yGa_{1-x-y}N$ (where $0 \leq X \leq 1$, $0 \leq Y \leq 1$, and $X+Y \leq 1$). The light-emitting element 31 can be mounted in a face-up manner in which a surface provided with electrodes faces upward or in a flip-chip in which a surface provided with electrodes faces downward. The protective element 32 may be mounted on the first lead or the second lead.

The protective element 32 is, for example, a Zener diode that protects the light-emitting element 31 against electric breakdown. In an example, the protective element 32 is mounted on the second lead 42 and electrically connected to the first lead 41 via the wire 34. While the configuration in which the light-emitting element 31 and the protective element 32 are disposed as the semiconductor elements 30 is described above, the protective element 32 may be omitted, or a plurality of light-emitting elements 31 may be disposed.

The wires 33 and 34 are electroconductive wirings, each electrically connecting a corresponding one of the semiconductor elements 30, such as the light-emitting element 31 and the protective element 32, with a corresponding one of the first lead 41 and the second lead 42. Examples of a material of the wires 33 and 34 include metals such as Au (gold), Ag (silver), Cu (copper), Pt (platinum), Al (aluminum), and alloys of these metals. Among these, Au is preferable in view of reliability.

The sealing member 50 is disposed in the recess 11 and covers the light-emitting element 31 and other components. The sealing member 50 is disposed to protect the light-emitting element 31 and the like against e.g., external forces, dust, and moisture, and to improve heat resistance, weather resistance, and light resistance of the light-emitting element 31 and the like. The sealing member 50 includes the filler-containing layer L2 containing the filler 52 and the light-transmissive layer L1 in this order from the bottom surface 15 of the recess 11. In one example, the sealing member 50 contains a phosphor 53 as well as the filler 52, and a phosphor layer L3 is formed along the bottom surface 15.

The sealing member 50 is light-transmissive for light emitted from the light-emitting element 31. More specifically, the sealing member 50 contains, as a base material, a light-transmissive resin 51 such as a silicone resin, an epoxy resin, or a urea resin. Further, the sealing member 50 includes the filler 52 serving as a material to reduce an amount of light emitted from the light-emitting element 31. The sealing member 50 may include materials as an additive member other than the filler 52. In the present embodiment, the sealing member 50 includes the phosphor 53.

In the case in which the sealing member 50 includes the phosphor 53, the phosphor layer L3 that includes the phosphor 53 is preferably disposed between the bottom surface of the recess 11 and the filler-containing layer L2. That is, the sealing member 50 includes the phosphor layer L3, the filler-containing layer L2, and the light-transmissive layer L1 in this order from the bottom surface 15 side of the recess 11. The boundaries between adjacent ones of the light-transmissive layer L1, the filler-containing layer L2, and the phosphor layer L3 are not clearly formed but are varied gradually in a predetermined range of each layer boundary. In the sealing member 50, the light-transmissive layer L1, the filler-containing layer L2, and the phosphor layer L3 are formed using centrifugal sedimentation in which a centrifugal force is applied for sedimentation, which will be described below.

The light-transmissive layer L1 is a supernatant layer obtained by sedimenting the filler and the phosphor in the sealing member 50 using the centrifugal force. The light-transmissive layer L1 is made of the light-transmissive resin 51 and has an upper surface that serves as a light extraction surface of the light-emitting device 1. The upper surface of the light-transmissive layer L1 (that is, the upper surface of the sealing member 50) may be a flat surface parallel to the bottom surface 15, or may be a concave surface having a central portion located lowest gradually curved toward the periphery of the opening. In a region between the bottom surface 15 of the recess 11 and the upper surface of the sealing member 50, the light-transmissive layer L1 may have a thickness of 30% or less, 20% or less, or 10% less of a distance between the upper surface of the sealing member 50 and the bottom surface 15.

The filler-containing layer L2 has a thickness equal to or larger than a height of the light-emitting element 31. The filler-containing layer L2 has a substantially flat upper surface located above the upper surface of the light-emitting element 31. In one example, the filler-containing layer L2 preferably has a height that is greater than the height of the top portion of the wire 33, connected to the light-emitting element 31, from the bottom surface 15, and more preferably has a height that is twice or more the height of the light-emitting element 31. The upper surface of the filler-containing layer L2 above the bottom surface 15 is located below the stepped portion 12. Accordingly, the filler-containing layer L2 does not cover the stepped portion 12, while the stepped portion 12 is covered by the light-transmissive layer L1 that contains substantially no filler. This structure allows for further improving adhesion between the package and the sealing member 50. The filler-containing layer L2 may be disposed in a region between the bottom surface 15 and the opening of the recess 11 to have a height in a range of 70% to 90% of the height from the bottom surface 15 toward the opening.

A filler having an average particle diameter of 200 nm or more and 500 nm or less is preferably used for the filler 52. With a particle diameter of 200 nm or more, the fillers 52 can easily scatter light in visible light region. However, with the particle diameter exceeding 500 nm, light transmissivity in the filler-containing layer L2 may be reduced, so that the scattered light may not be easily extracted to the outside. With the filler 52 having the average particle diameter within the range described above, light emitted from the light-emitting element 31 can be efficiently scattered when the light passes through the filler-containing layer L2 and the scattered light can be efficiently extracted to outside. Accordingly, a light-emitting device with reduced glare and a reduced luminous intensity can be obtained.

The filler 52 preferably has a spherical shape or a shape close to a spherical shape for ease of fluidity in the light-transmissive resin 51. This allows the filler 52 to be accumulated in the filler-containing layer L2 at a substantially uniform concentration.

The content of the filler 52 is preferably in a range of 2 to 10 mass % in the light-transmissive resin. If the content of the filler 52 is lower than 2 mass %, the light intensity may be greater than a required low intensity. If the content of the filler 52 is greater than 10 mass %, light may be reflected among the fillers 52, so that light is not easily extracted, which may result in excessively small the light intensity.

Examples of a technique for measuring the average particle diameter include laser diffraction and scattering, image analysis (such as scanning electron microscopy (SEM) and transmission electron microscopy (TEM)), dynamic light scattering, and small-angle X-ray scattering.

Examples of the filler 52 include titanium oxide, silica, silicon oxide, aluminum oxide, zirconium oxide, magnesium oxide, potassium titanate, zinc oxide, and boron nitride. Among these materials, titanium oxide, which has a comparatively high refractive index, is preferably used in view of reflection of light.

Known surface treatments using agents such as silane coupling agent or titanium-coupling agent may be applied to the filler 52. For the agents used for the surface treatment, silane coupling agents is preferable used, and aminosilane is particularly preferably used. Performing surface treatment using the silane coupling agent and the like allows for facilitating mixing of the filler 52 and the light-transmissive resin 51 and smoothening the surface of the filler 52. This is considered to facilitate sedimentation of the filler 52.

In the sealing member 50, the phosphor 53 forms the phosphor layer L3 and is disposed on the upper surface of the light-emitting element 31 and the bottom surface 15 of the recess 11. The phosphor layer L3 is formed to have a thickness equal to or less than a half of the height of the light-emitting element 31.

A phosphor having a higher specific gravity than the filler 52 is preferably used for the phosphor 53. This allows the phosphor 53 to be sedimented at a portion closer to the bottom surface 15 of the recess 11. The average particle diameter of the phosphor 53 is, for example, 3 μm or more and 50 μm or less.

A substance known in the art can be used for the phosphor 53. For example, a yellow phosphor such as YAG ($Y_3Al_5O_{12}$:Ce) or silicates, a red phosphor such as CASN ($CaAlSiN_3$:Eu) or KSF ($K_2SiF_6$:Mn), or a green phosphor such as chlorosilicates or $BaSiO_4$:$Eu^{2+}$ can be used. A plurality of types of phosphors may be used in combination. For example, phosphors having different luminescent colors may be used in combination or in a blending ratio appropriate for a desired color to adjust color rendering properties or color reproducibility.

Method of Manufacturing Light Emitting Device

Figure 4:
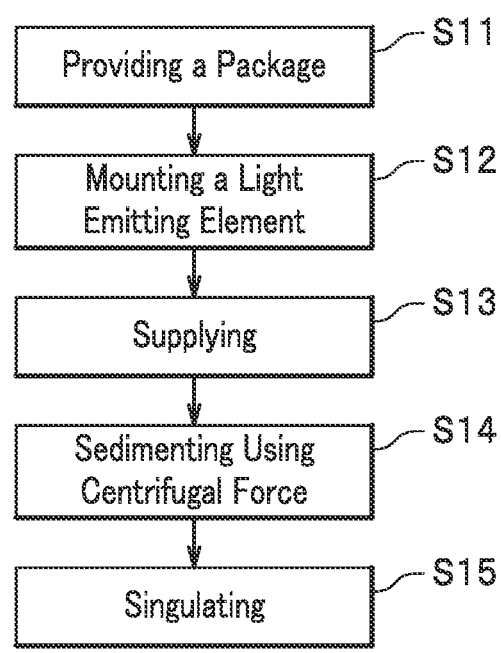
FIG. 4 is a flowchart illustrating a method of manufacturing the light-emitting device according to one embodiment.
Figure 5:
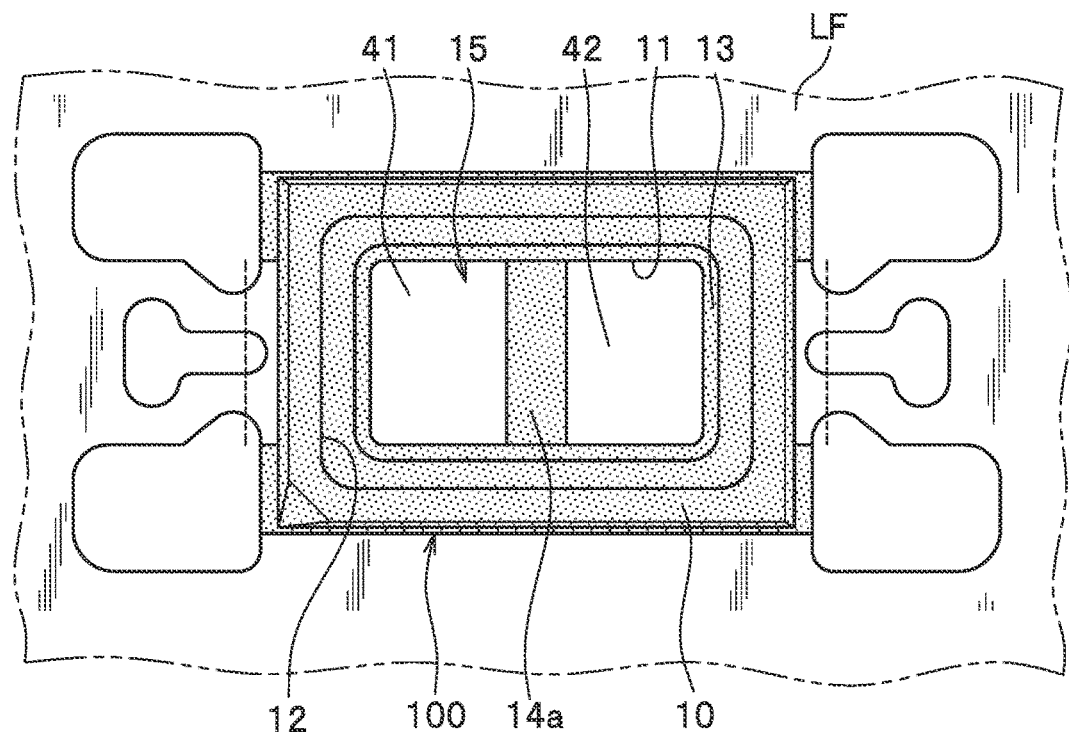
FIG. 5 is a schematic partial enlarged view of a lead frame, illustrating a resin body disposed on a first lead and a second lead in the method of manufacturing the light-emitting device according to one embodiment.
Figure 6:
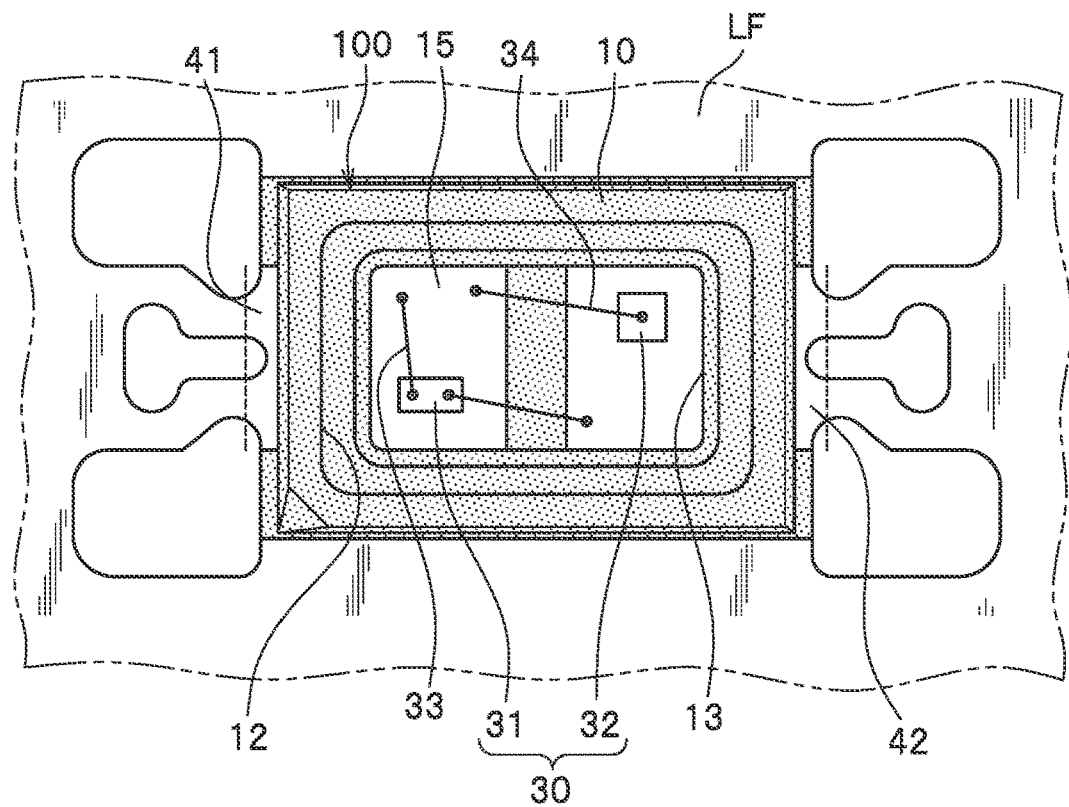
FIG. 6 is a schematic partial enlarged view of the lead frame, illustrating a light-emitting element and a protective element that are disposed in a recess of the resin body in the method of manufacturing the light-emitting device according to one embodiment.
Figure 7:
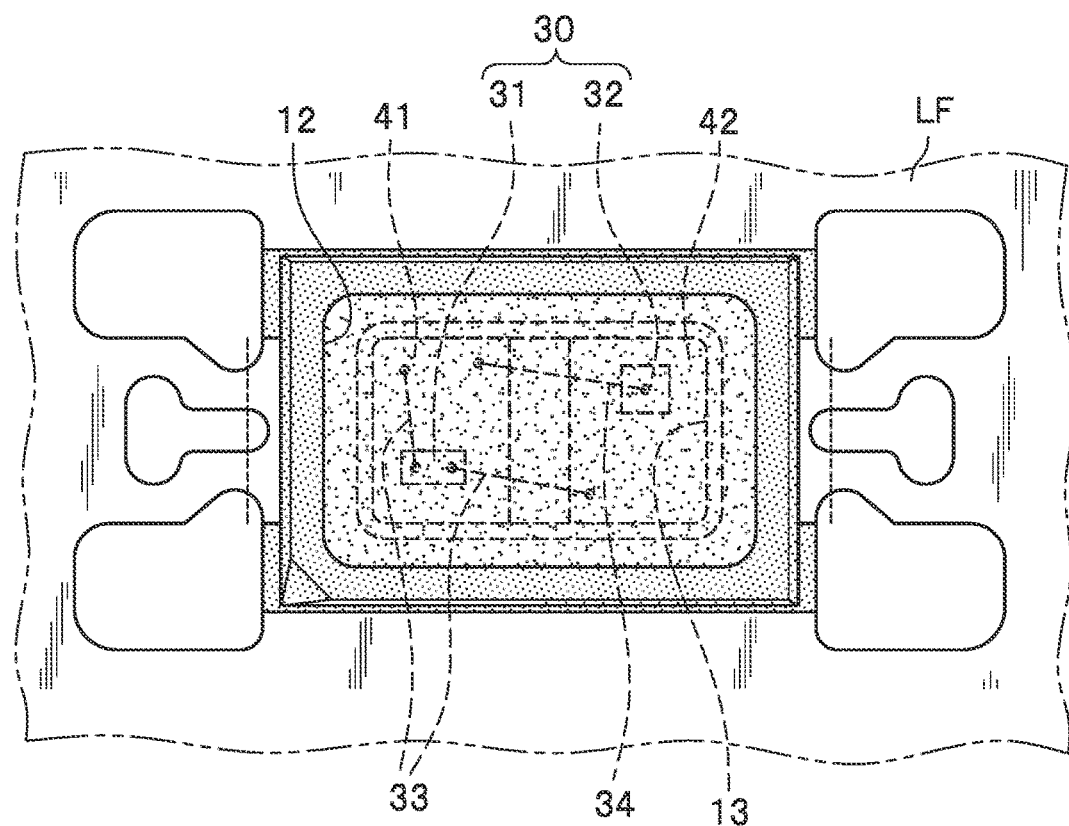
FIG. 7 is a schematic enlarged view of the lead frame with the light-emitting device disposed thereon, illustrating the recess filled with a sealing member in the method of manufacturing the light-emitting device according to one embodiment.
Figure 8:
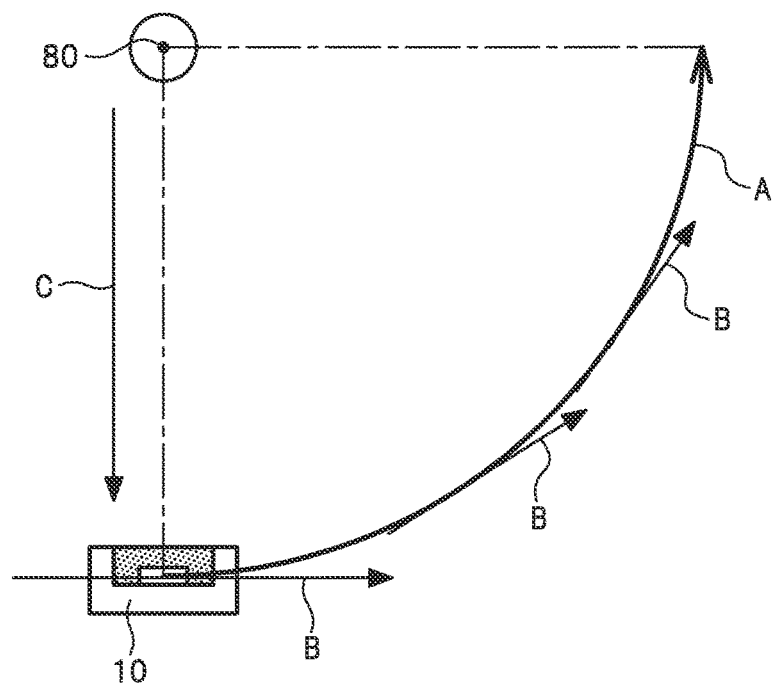
FIG. 8 is a schematic diagram illustrating a step of sedimenting using a centrifugal force in the method of manufacturing the light-emitting device according to one embodiment.
Figure 9:
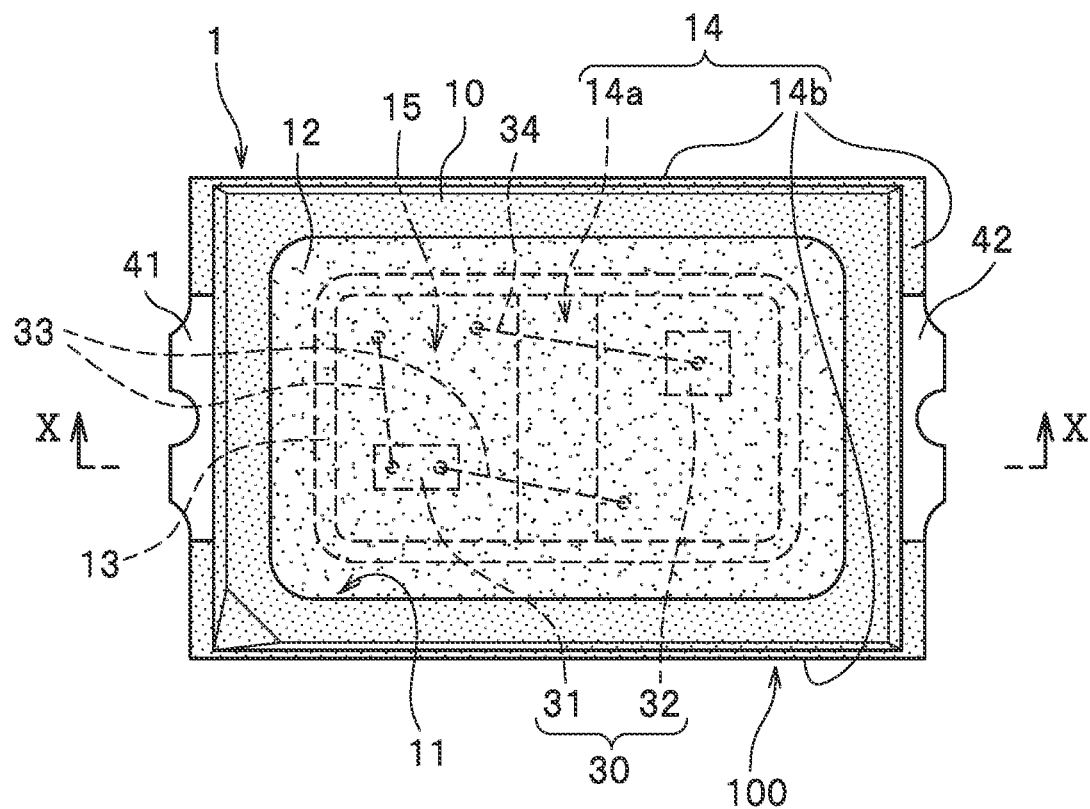
FIG. 9 is a schematic enlarged plan view illustrating a singulated light-emitting device in the method of manufacturing the light-emitting device according to one embodiment.
Figure 10:
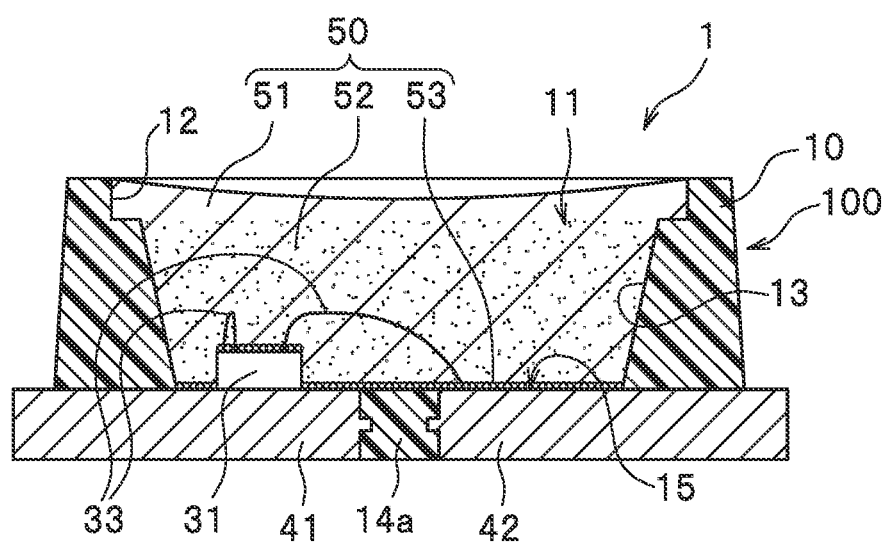
FIG. 10 is a schematic cross-sectional view taken along line X-X of FIG. 9.

Next, a method of manufacturing the light-emitting device 1 will be described with reference to FIGS. 4 to 10. FIG. 4 is a flowchart illustrating the method of manufacturing the light-emitting device according to one embodiment. FIG. 5 is a schematic partial enlarged view of a lead frame, illustrating a resin body disposed on a first lead and a second lead in the method of manufacturing the light-emitting device according to one embodiment. FIG. 6 is a schematic partial enlarged view of the lead frame, illustrating a light-emitting element and a protective element that are disposed in a recess of the resin body in the method of manufacturing the light-emitting device according to one embodiment. FIG. 7 is a schematic enlarged diagram of the lead frame on which the light-emitting device is disposed, illustrating the recess being filled with a sealing member in the method of manufacturing the light-emitting device according to the embodiment. FIG. 8 is a schematic diagram illustrating a step of sedimenting using a centrifugal force in the method of manufacturing the light-emitting device according to the embodiment. FIG. 9 is a schematic enlarged plan view illustrating a singulated light-emitting device in the method of manufacturing the light-emitting device according to the embodiment. FIG. 10 is a schematic cross-sectional view taken along line X-X of FIG. 9.

The method of manufacturing the light-emitting device includes: a step S11 of providing a package 100 defining a recess 11; a step S12 of mounting a light-emitting element 31 on a bottom surface 15 of the recess 11; a step S13 of supplying an uncured sealing member 50 that includes a light-transmissive resin 51 containing a filler 52 with an average particle diameter of 200 nm or more and 500 nm or less into the recess 11; and a step S14 of sedimenting the filler 52 toward the bottom surface 15 using a centrifugal force applied to the package 100 in a direction perpendicular to the bottom surface 15 of the recess 11 to form a filler-containing layer L2 that contains the filler 52 and a light-transmissive layer L1 in this order from the bottom surface 15 of the recess 11. In the method of manufacturing the light-emitting device, the sealing member 50 may further include a phosphor 53 and in the step S14 of sedimenting using a centrifugal force, a phosphor layer L3 that includes the phosphor 53 may be disposed at a portion closer to the bottom surface 15 of the recess 11 than the filler-containing layer L2.

Step S11 of Providing a Package

In the step S11 of providing a package, the package 100 defining the recess 11 is provided. In one example, a lead frame LF formed with a plurality of resin bodies 10 is provided to provide packages 10 each including a corresponding portion of the lead frame LF and a corresponding one of the resin bodies 10. In each drawing, a single package 100 is shown, and illustration of other packages 100 is omitted to simplify the description. The lead frame LF used herein is made of, for example, good electric conductors such as copper or copper alloys, and can have a flat metal plate shape. Alternatively, a metal plate with a stepped portion or an uneven surface may also be used. The lead frame LF is formed by punching or etching a flat metal plate. A portion of the lead frame LF corresponding to a single package 100 includes a first lead 41 and a second lead 42.

Other examples of a structure having packages each defining a recess include a collective substrate including ceramic packages provided with wiring members.

Step S12 of Mounting a Light Emitting Element

In the step S12 of mounting a light emitting element, the light-emitting element 31 is mounted on the bottom surface 15 of the recess 11 of the package 100. Instead of the light-emitting element 31, the semiconductor element 30 such as a protective element 32 may be mounted. The light-emitting element 31 used in this example includes a pair of electrodes on the same surface side (for example, the upper surface side). In this case, the light-emitting element 31 is mounted via an adhesive applied on the first lead exposed at the bottom surface 15 of the recess 11 of the package 100, and the electrodes of the light-emitting element 31 are electrically connected to the first lead and the second lead via respective wires 33. Also, when using an upper-and-lower electrode type light emitting element, either one of the upper and lower electrodes is mounted on a corresponding one of the leads via an electroconductive adhesive, while the other one of the upper and lower electrodes is electrically connected to another corresponding one of the leads via a wire 33. Also, when using an upper-and-lower electrode light-emitting element, the electrical connection to the first lead is established using electroconductive adhesive. In this example, an upper-and-lower electrode element is used for the protective element 32, and is bonded to the second lead using the electroconductive adhesive.

Step S13 of Supplying

In the step S13 of supplying, the uncured sealing member 50 is supplied into the recess 11. The sealing member 50 includes the light-transmissive resin 51 serving as a base material and the filler 52 having an average particle diameter of 200 nm or more and 500 nm or less. In the step S13 of supplying, the filler 52 and the phosphor 53 are contained in the light-transmissive resin 51. In the step S13 of supplying, for example, the uncured resin materials that will be cured to be the sealing member 50 after being cured is supplied into the recess 11 of the package 100 using a resin filling device to seal the light-emitting element 31 and the protective element 32. The package 100 in which the resin material is supplied is subjected to the step S14 of sedimenting using a centrifugal force.

Step S14 of Sedimenting Using Centrifugal Force

In the step S14 of sedimenting using a centrifugal force, a centrifugal force is applied to the package 100 in a direction perpendicular to the bottom surface 15 of the recess 11 to sediment the filler 52 and the phosphor 53 toward the bottom surface 15, so that the phosphor layer L3 that contains the phosphor 53, the filler-containing layer L2 that contains the filler 52, and the light-transmissive layer L1 are formed in this order from the bottom surface 15 side of the recess 11. In the step S14 of sedimenting using a centrifugal force, the package 100 is subjected to centrifugal rotation such that the centrifugal force is applied to the bottom surface of the recess 11. This allows the phosphor 53 having a high specific gravity to move toward the bottom surface 15 of the recess 11, and allows the filler 52 to move near the bottom surface 15 of the recess 11. Then, in the sealing member 50, the filler 52 and the phosphor 53 are accumulated at the bottom surface 15 side of the recess 11, so that the light-transmissive layer L1 is formed as a supernatant layer at an outermost surface side. The content of the filler 52 used herein is in a range of 2 to 10 mass % to the light-transmissive resin 51. The filler-containing layer L2 has a height that is greater than, preferably twice or more, the height of the upper surface of the light-emitting element 31 from the bottom surface 15. In this example, the filler-containing layer L2 is formed such that the filler 52 is accumulated at a portion from the phosphor layer L3 to a portion directly below the stepped portion 12.

In the present embodiment, the sealing member 50 includes the filler 52. In the sealing member 50, the filler 52 is forcedly accumulated using a centrifugal force toward the bottom surface to form the filler-containing layer L2. This allows for obtaining a light-emitting device 1 having a reduced luminous intensity when the light-emitting device 1 is turned on. When the filler-containing layer L2 has a thickness described above, the fillers 52 can be arranged with an appropriate clearance between each other. Accordingly, excessive hindering of light extraction due to dense arrangement of the fillers 52 can be prevented.

By applying a centrifugal force of more than a predetermined value (for example, 100×g or more), in the light-transmissive resin 51, the phosphor 53 having a high specific gravity is moved toward the bottom surface 15, and the filler 52 and the phosphor 53 can be easily separated from each other to be the filler-containing layer L2 and the phosphor layer L3, respectively.

The package 100 is preferably rotated about a rotation axis 80 that allows a centrifugal force to be applied to the package 100 with the bottom surface 15 of the recess 11 facing outward.

More specifically, the package 100 is moved in a direction A that revolves around the rotation axis 80 at a positional relationship that the upper surface of the package 100 faces the rotational axis 80. A direction B in FIG. 8 is parallel to the bottom surface of the recess 11. The rotation axis 80 is an axis parallel to the bottom surface of the recess 11, is located on a line perpendicular to the bottom surface of the recess 11 and passing through substantially the center of the bottom surface of the recess 11, and faces the opening of the recess 11 of the package 100. Accordingly, a centrifugal force is applied in a direction toward the bottom surface of the recess 11 to reduce spread of the sealing member 50 in a height direction of the package 100 and to forcedly sediment the filler 52 and the phosphor 53 contained in the sealing member 50 toward the bottom surface 15 (in the direction indicated by an arrow C in FIG. 8) of the recess 11. Curing the sealing member 50 after forcible sedimentation forms the phosphor layer L3 that contains the phosphor 53, the filler-containing layer L2 that contains the filler 52, and the light-transmissive layer L1 made of the light-transmissive resin 51 in this order from the bottom surface 15 of the recess 11 toward the opening of the recess 11.

The light-transmissive layer L1 and the filler-containing layer L2 are formed to be separated by the stepped portion 12 located at the opening of the recess 11. With the light-transmissive layer L1 covering the stepped portion 12 defining a larger opening area, the irradiation area can be increased. This can reduce luminance of the light-emitting device 1. The boundary of the light-transmissive layer L1 and the filler-containing layer L2 is not clearly formed, but the light-transmissive layer L1 and the filler-containing layer L2 are formed such that the number of particles of the filler 52 per unit area is largely reduced at a portion and is gradually reduced from the portion toward the light-transmissive layer L1. The phosphor 53 is disposed also on the upper surface of the light-emitting element 31 and extends along the bottom surface 15 to form the phosphor layer L3.

The speed and the number of rotation in the centrifugal rotation of the package 100 is adjusted according to the content and particle diameter of the filler 52. In one example, the number of rotation and the radius of gyration is adjusted such that, for example, a centrifugal force of 200×g or more and 300×g or less is applied.

When the packages 100 in the state of a collective substrate before being singulated is subjected to centrifugal rotation in the manufacturing, if the collective substrate has a flat plate shape, the larger the planar area of the collective substrate is, the larger the deviations of package 100 located away from the center of the collective substrate from the rotation axis 80 are. For example, if the deviation in direction B from the rotation circumference in the collective substrate is large, a surface of the sealing member 50 is inclined to the bottom surface 15 of the recess 11, and the state of the surface of the sealing member 50 may vary over the collective substrate. The deviation can be reduced by increasing the radius of gyration. More specifically, the deviation can be reduced by employing a radius of gyration that is 70 times or more as large as the length of the collective substrate disposed in the direction of rotation.

In the case of using the package 100 having flexibility in which the collective substrate flexes along the rotation circumference of the gyration radius by the centrifugal force, deviations described above is less likely to occur in the package 100. Thus, rotation can be performed with a larger collective substrate than in the case of employing a collective substrate including a non-flexible packages 100 under the same centrifugal force. This can increase the number of packages to be treated at a single time.

Step S15 of Singulating

In the step S15 of singulating, the lead frame LF is divided at predetermined positions after the sealing member 50 is cured. In the step S15 of singulating, the lead frame LF is divided into individual light-emitting devices 1. In a singulated light-emitting device 1, the outer lead portions of the first lead 41 and the second lead 42 protrude laterally from the lateral surfaces of the package 100 to have a predetermined shape.

Experiment

Light-emitting devices were manufactured in which the phosphor 53 was contained in the sealing member 50 at the predetermined content, such that some of the light-emitting devices contained titanium oxide as the filler 52 and others of the light-emitting devices did not contain titanium oxide as the filler 52. Luminous intensities were compared between the light-emitting devices that contained titanium oxide as the filler 52 and the light-emitting devices that did not contain titanium oxide as the filler 52. The measured data will be described below.

The light-emitting device of a comparative example, which is a reference of a comparison, contained 6.25 mass % of the YAG phosphor for the phosphor 53 in a silicon resin of the light-transmissive resin 51 serving as a base material, without containing titanium oxide as the filler 52.

In comparison, the light-emitting device according to an embodiment of the present disclosure contained 2.7 mass % of titanium oxide having an average particle diameter of 250 nm for the filler 52 together with 5.12 mass % of the YAG phosphor for the phosphor 53 in the silicone resin of the light-transmissive resin 51 serving as a base material.

The packages of the light-emitting devices employed the same structure, which is described below.

The outer shape of the package had a size of 2.2 mm in width, 1.4 mm in length, and 0.7 mm in thickness. The recess had a size of 1.09 mm by 1.62 mm at the opening, with a depth of 0.5 mm. Further, the lead frame LF was made of a copper alloy plated with Ni/Pd/Au. The light-emitting element had a size of 230 μm in width, 120 μm in length, and 85 μm in thickness. The mounting surface of the light-emitting element was Al-metalized. The protective element had a size of 180 μm in width and length and 135 μm in thickness. A thermoplastic resin was used for the resin for the package. The light-emitting element was disposed on the electrodes of the lead frame LF via a die-bonding material, and a silicone resin was used for the die-bonding material. The wires made of Au and having a size of 26 µm in diameter were employed.

The light-emitting device of the comparative example and the light-emitting device according to one embodiment were different in the content of the phosphor. Based on the applied currents of 10 mA for the light-emitting device of the comparative example and 5 mA for the light-emitting device according to the embodiment, the contents of the phosphor were adjusted such that chromaticity was within an area formed by connecting four points in an XY-chromaticity diagram, namely, (X=0.2730, Y=0.2610), (X=0.2653, Y=0.2709), (X=0.2722, Y=0.2805), and (X=0.2790, Y=0.2700). For values of light-emitting devices in the comparative example, 89,517 light-emitting devices were examined, and the average value of the 89,517 light-emitting devices was determined. For values of light-emitting devices in one embodiment, 10,227 light-emitting devices were examined, and the average value of the 10,227 light-emitting devices was determined.

The average luminous intensity of the light-emitting devices of the comparative example was 439 mcd with an applied current of 10 mA. Meanwhile, the average luminous intensity of the light-emitting devices of the embodiment was 75.3 mcd with an applied current of 5 mA. A spectrometer (OCM-510C) manufactured by Nicety Technologies Inc. was used as the measuring instrument. It is found that when half a current of the light-emitting device of the comparative example was applied to the light-emitting device of one embodiment, the luminous intensity was approximately one-fifth of the luminous intensity of the light-emitting device of the comparative example. Thus, the result shows that containing the filler 52 with the condition described above in the light-transmissive resin 51 allowed for reducing the luminous intensity. For reference, luminous intensities of ten light-emitting devices of one embodiment were measured with the applied current of 10 mA, and the average value of the luminous intensities was 152.6 mcd. The photonic multichannel analyzer (PMA-11) manufactured by Hamamatsu Photonics K.K. was used as the measuring instrument.

While the light-emitting device according to certain embodiments of the present disclosure has been specifically described, the scope of the present disclosure is not limited by these descriptions and should be broadly interpreted on the basis of the claims. The scope of the present disclosure also encompasses various modifications based on these descriptions. For example, in the method of manufacturing the light-emitting device, while the step of applying a centrifugal force is performed over a lead frame for a substrate in the description above, the step of applying a centrifugal force may be performed for each of singulated light-emitting devices or for groups of a plurality of light-emitting devices. Also, the stepped portion may have two or more steps from the upper surface toward the bottom surface of the recess, or may be in a form of a deep step.

The light-emitting device according to certain embodiments of the present disclosure can be used for light-emitting devices for lighting apparatuses and vehicles.

What is claimed is:

1. A light-emitting device comprising:
   a package defining a recess;
   a light-emitting element disposed on a bottom surface of the recess; and
   a sealing member disposed in the recess so as to cover the light-emitting element, wherein:
   the sealing member comprises a filler-containing layer which contains a light-reflective filler and a light-transmissive resin and covers the light-emitting element, and a light-transmissive layer which contains the light-transmissive resin, is free of the light-reflective filler, and is disposed on the filler-containing layer,
   the recess is further defined by a lateral surface having a stepped portion between the bottom surface of the recess and an opening of the recess,
   the light-transmissive layer covers the stepped portion,
   an upper surface of the light-transmissive layer is downwardly recessed,
   an entire upper surface of the filler-containing layer is below the stepped portion, and
   the upper surface of the light-reflective filler in the filler-containing layer is directly below the stepped portion.

2. The light-emitting device according to claim 1, wherein:
   the filler-containing layer has a thickness of twice or more of the height of the light-emitting element.

3. The light-emitting device according to claim 1, wherein:
   the light-reflective filler is composed of at least one of titanium oxide, silica, silicon oxide, aluminum oxide, zirconium oxide, magnesium oxide, potassium titanate, zinc oxide, or boron nitride.

4. The light-emitting device according to claim 1, wherein:
   the sealing member is formed by:
      supplying an uncured sealing member into the recess, the uncured sealing member comprising the light-reflective filler and the light-transmissive resin, and
      applying a centrifugal force to the package in a direction perpendicular to the bottom surface of the recess to sediment the light-reflective filler toward the bottom surface of the recess to form the filler-containing layer and the light-transmissive layer.

5. The light-emitting device according to claim 1, wherein:
   the sealing member further comprises a phosphor layer containing a phosphor, and the filler-containing layer is disposed between the phosphor layer and the light-transmissive layer.

6. The light-emitting device according to claim 5, wherein:
   the phosphor layer covers the bottom surface of the recess and an upper surface of the light-emitting element.

7. The light-emitting device according to claim 5, wherein:
   the phosphor layer has a thickness of equal to or less than half the height of the light-emitting element.

8. The light-emitting device according to claim 5, wherein:
   the filler-containing layer does not contain a phosphor.

9. A light-emitting device comprising:
   a package defining a recess;
   a light-emitting element disposed on a bottom surface of the recess; and
   a sealing member disposed in the recess so as to cover the light-emitting element, wherein:
   the sealing member comprises a filler-containing layer which contains a filler and a light-transmissive resin and covers the light-emitting element, a light-transmissive layer which contains the light-transmissive resin and is disposed on the filler-containing layer, and a phosphor layer which contains a phosphor, wherein the filler-containing layer does not contain a phosphor, the recess is further defined by a lateral surface having a stepped portion between the bottom surface of the recess and an opening of the recess, the light-transmissive layer covers the stepped portion, an upper surface of the light-transmissive layer is downwardly recessed, an entire upper surface of the filler-containing layer is below the stepped portion, and the upper surface of the filler in the filler-containing layer is directly below the stepped portion.

10. The light-emitting device according to claim 9, wherein:

the phosphor layer covers the bottom surface of the recess and an upper surface of the light-emitting element.

11. The light-emitting device according to claim 9, wherein:

the phosphor layer has a thickness of equal to or less than half the height of the light-emitting element.

* * * * *